United States Patent
Tripsas et al.

(10) Patent No.: US 6,579,778 B1
(45) Date of Patent: Jun. 17, 2003

(54) SOURCE BUS FORMATION FOR A FLASH MEMORY USING SILICIDE

(75) Inventors: Nicholas H. Tripsas, San Jose, CA (US); Mark Ramsbey, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 46 days.

(21) Appl. No.: 09/634,991

(22) Filed: Aug. 8, 2000

Related U.S. Application Data

(60) Provisional application No. 60/148,069, filed on Aug. 10, 1999.

(51) Int. Cl.[7] .............................................. H01L 21/76
(52) U.S. Cl. ....................... 438/447; 438/211; 438/221; 438/257; 438/264; 438/262; 438/294; 438/524; 438/533; 438/593; 438/594; 438/430; 438/445; 438/453; 438/682
(58) Field of Search ................................. 438/211, 221, 438/257, 264, 296, 524, 533, 593, 594, 262, 430, 447, 445, 453, 682

(56) References Cited

U.S. PATENT DOCUMENTS

| | | | |
|---|---|---|---|
| 4,774,197 A | 9/1988 | Haddad et al. | |
| 5,470,773 A | 11/1995 | Liu et al. | |
| 5,517,443 A | 5/1996 | Liu et al. | |
| 5,534,455 A | 7/1996 | Liu | |
| 5,962,890 A | * 10/1999 | Sato | 257/320 |
| 6,001,687 A | * 12/1999 | Chu et al. | 438/257 |
| 6,103,574 A | * 8/2000 | Iwasaki | 257/506 |
| 6,218,265 B1 | * 4/2001 | Colpani | 257/332 |
| 6,229,167 B1 | * 5/2001 | Ozawa | 257/295 |
| 6,429,093 B1 | * 8/2002 | Xia et al. | 438/447 |

OTHER PUBLICATIONS

Chang et al, ULSI Technology, 1996, McGraw–Hill, pp. 394–397, 480.*
Wolf et al, Silicon Processing for the VLSI Era, 1986, Lattice Press, vol. 1, p. 390.*

* cited by examiner

*Primary Examiner*—Matthew Smith
*Assistant Examiner*—V. Yevsikov

(57) ABSTRACT

A semiconductor flash memory device is formed with shallow trench isolation (STI) and a low-resistance source bus line (Vss Bus). Embodiments include forming core and peripheral field oxide regions, as by conventional STI techniques, bit lines by ion implantation, polysilicon floating gates above the channel regions and polysilicon word lines. The Vss Bus is then formed by etching away portions of the field oxide between corresponding source regions of adjacent bit lines to expose portions of the substrate, ion implanting impurities into the source regions and the exposed substrate, forming insulating spacers on the sides of the floating gates and word lines, and forming a metal silicide layer, such as titanium silicide, on the implanted source regions and exposed portions of the substrate to form a continuous conductor between the source regions. The metal silicide layer provides a low-resistance Vss, thereby improving device performance, while the implanted impurities ensure that the substrate will not short circuit to source and drain regions through the metal silicide.

23 Claims, 11 Drawing Sheets

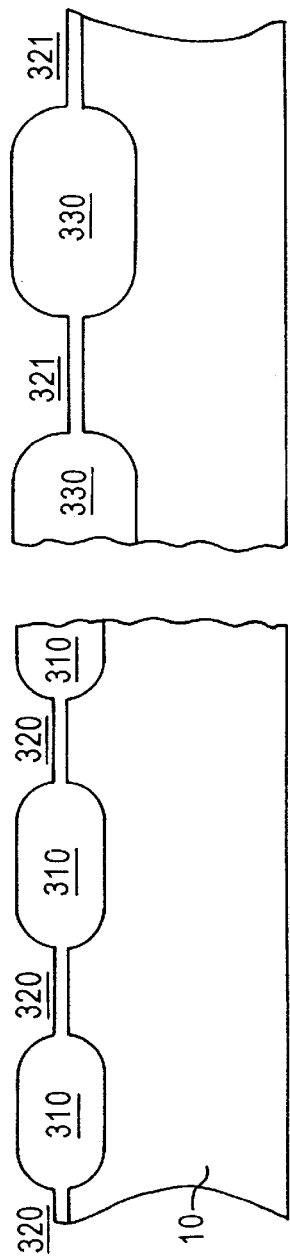
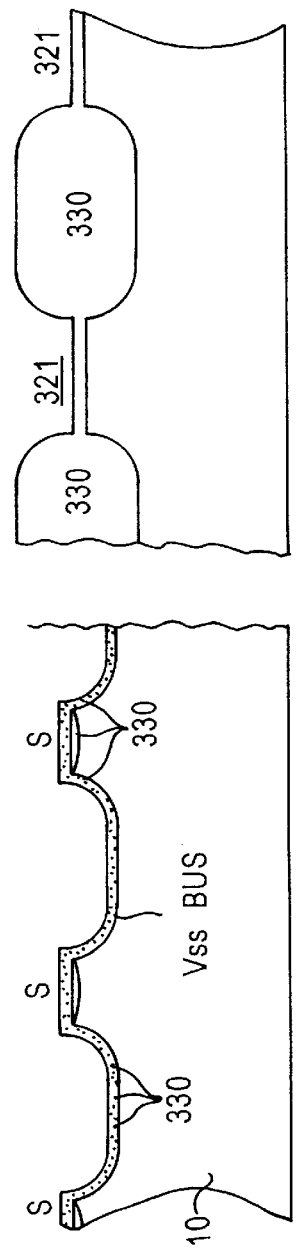
FIG. 3A (PRIOR ART)
FIG. 3B (PRIOR ART)

US 6,579,778 B1

SOURCE BUS FORMATION FOR A FLASH MEMORY USING SILICIDE

RELATED APPLICATIONS

This application claims priority from U.S. Provisional Patent Application No. 60/148,069, filed on Aug. 10, 1999, and is incorporated herein by reference.

FIELD OF THE INVENTION

The present invention relates to a method of manufacturing a memory device on a semiconductor substrate. The present invention has particular applicability in manufacturing nonvolatile semiconductor memory devices having a source bus.

BACKGROUND ART

Conventional nonvolatile semiconductor memories, such as flash electrically erasable programmable read only memories (flash EEPROMs), typically comprise a floating gate memory cell, which includes a source region, a drain region and a channel region formed in a semiconductor substrate, and a floating gate formed above the substrate between the channel region and a control gate. A voltage differential is created in the cell when a high voltage is applied to the control gate while the channel region is kept at a low voltage, causing injection of electrons from the channel region into the floating gate, as by tunneling, thereby charging the floating gate. This movement of electrons is referred to as programming, and the high voltage (i.e., about 18 volts) applied to the control gate is known as program voltage.

FIG. 1 depicts a typical floating gate memory cell 120, which includes source/drain regions 220 and channel region 230 formed in substrate 210, such as by implantation of impurities, tunnel oxide 240 of about 95 Å, polysilicon floating gate 250, dielectric layer 260 and polysilicon control gate 270.

A typical architecture for a flash memory system includes several strings of floating gate memory transistors (or "memory cells") 120 which form an array or "memory core". A "source line" connects the sources of the strings. Peripheral devices, such as power transistors (not shown) supply voltages of up to 23 volts for programming and other functions of the memory system. The flash memory system described above is typically manufactured on semiconductor substrate 210 as illustrated in FIGS. 1, 2, 3A and 3B. Initially, as depicted in FIG. 3A, field isolation regions 310, 330 are formed, as by local oxidation of silicon (LOCOS), for the memory core and for peripheral circuitry, which will be formed in areas 321. As shown in FIG. 2, the core field oxide regions 310 are typically formed as parallel rows separated by channel areas 320. Source/drain regions S, D and channel regions (not shown) are thereafter formed in substrate 210 by implantation of impurities, followed by tunnel oxide layer 240 of the core memory cells and gate oxide layer of the peripheral devices (not shown), as by thermal oxidation. A first layer of polysilicon ("the poly1 layer"), which, after a series of etching steps, will form the floating gates 250 of the memory cells 120 and the gates of the peripheral devices, is then deposited, as by low pressure chemical vapor deposition (LPCVD), masked and etched.

In subsequent processing steps (not shown), a dielectric layer (reference numeral 260 in FIG. 1) is deposited, masked and etched, followed by deposition of a second polysilicon layer ("the poly2 layer"), which is masked and etched to form control gates 270/word lines WL (see FIGS. 1 and 2). At the same time the poly2 layer is etched, the poly1 layer is further etched in the core memory cell area to complete formation of floating gates 250.

Thereafter, the source line Vss Bus (see FIG. 3B) is formed by a "self aligned source" technique (SAS). Referring to FIG. 3B, which is a cross-sectional view taken through line A–A' in FIG. 2, field oxide 310 between the sources S is etched away and impurities 330 are implanted in substrate 210, such as arsenic or phosphorus by ion implantation, after masking, to form conductive line Vss Bus connecting sources S.

The current demands for miniaturization into the deep submicron range for increased circuit density require formation of device features with high precision and uniformity, including optimization of memory cell isolation and peripheral circuit isolation, to maintain the performance of the flash memory system. To improve isolation in flash memory systems, a type of isolation structure known as trench isolation is used, as depicted in FIG. 4A, wherein shallow trenches 410 are etched in the substrate 400 and an oxide liner 420 is thermally grown on the trench walls. Trench 410 is then refilled with an insulating material 430. The resulting structure is referred to as a shallow trench isolation (STI) structure.

Disadvantageously, when the SAS technique is used with an STI isolation scheme to form Vss Bus, liner 420 and insulating material 430 are etched away, leaving severe topography due to the steepness of trench sidewalls 410a (see FIG. 4B). Consequently, when impurities 440 are implanted during SAS formation, trench sidewalls 410a do not receive a sufficient amount of dopant (due to their shallow angle with respect to the incoming implanted ions) and therefore have high resistivity. As a result, the overall resistance of Vss Bus is higher than optimal, thus degrading the performance of the finished device.

There exists a need for a flash memory methodology enabling utilization of STI and formation of a Vss Bus without undesirable electrical characteristics, thereby improving device performance and reliability.

SUMMARY OF THE INVENTION

An advantage of the present invention is a method of manufacturing a flash memory with STI and a low-resistance Vss Bus.

Additional advantages and other features of the present invention will be set forth in part in the description which follows and in part will become apparent to those having ordinary skill in the art upon examination of the following or may be learned from the practice of the present invention. The objects and advantages of the present invention may be realized and obtained as particularly pointed out in the appended claims.

According to the present invention, the foregoing and other advantages are achieved in part by a method of manufacturing a semiconductor device, which method comprises forming a memory core region on a semiconductor substrate as a plurality of substantially parallel, substantially rectangular rows of field oxide separated at a first portion of each row by a source region and at a second portion of each row by a channel region adjacent to the source region; forming a polysilicon floating gate above each channel region; etching to remove the first portion of each row and expose a portion of the substrate corresponding to the first portion; forming a protective oxide spacer on a sidewall of each floating gate, the protective spacers extending onto each source region; ion implanting impurities into the source regions and the exposed portions of the substrate corresponding to the first portion of each row to form a layer of the impurities; and forming a metal silicide layer on the source regions and the exposed portions of the substrate corresponding to the first portion of each row to form a continuous conductor.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein:

FIG. 3A illustrates a sequential phase in the formation of a conventional flash memory system.

FIG. 3B is a cross-sectional view taken along line A—A of FIG. 3A.

DESCRIPTION OF THE INVENTION

Conventional methodologies for flash memory manufacture which utilize STI result in Vss Bus lines having high resistance. The present invention addresses and solves this problem stemming from conventional manufacturing processes.

According to the present invention, core and peripheral field oxide regions are initially formed in a semiconductor substrate, as by conventional STI techniques, in the form of substantially parallel, substantially rectangular rows. As used throughout the present disclosure and claims, the term "substrate" denotes a semiconductor substrate or an epitaxial layer formed on the semiconductor substrate. Memory cells and select transistors are then conventionally formed by implanting source regions, drain regions and channel regions between the oxide rows, and forming polysilicon floating gates above the channel regions. Polysilicon word lines, which act as memory cell control gates, are formed substantially perpendicular to the oxide rows and above the floating gates.

Thereafter, in accordance with embodiments of the present invention, an SAS process is carried out to form the Vss Bus. Portions of the field oxide between corresponding source regions of adjacent bit lines are etched away to expose portions of the substrate. Impurities, such as arsenic or phosphorus, are ion implanted into the source regions and the exposed substrate, then insulating spacers are formed on the side surfaces of the floating gates and word lines, and a metal silicide layer, such as titanium silicide, is formed on the implanted source regions and exposed portions of the substrate to form a continuous conductor between the source regions. The metal silicide layer is formed by sputtering a metal layer and performing rapid thermal annealing (RTA), or by selectively depositing the metal silicide layer. The metal silicide layer advantageously provides a low-resistance Vss, while the implanted impurities ensure that the substrate will not short circuit to the source and drain regions through the metal silicide.

Figure 1:
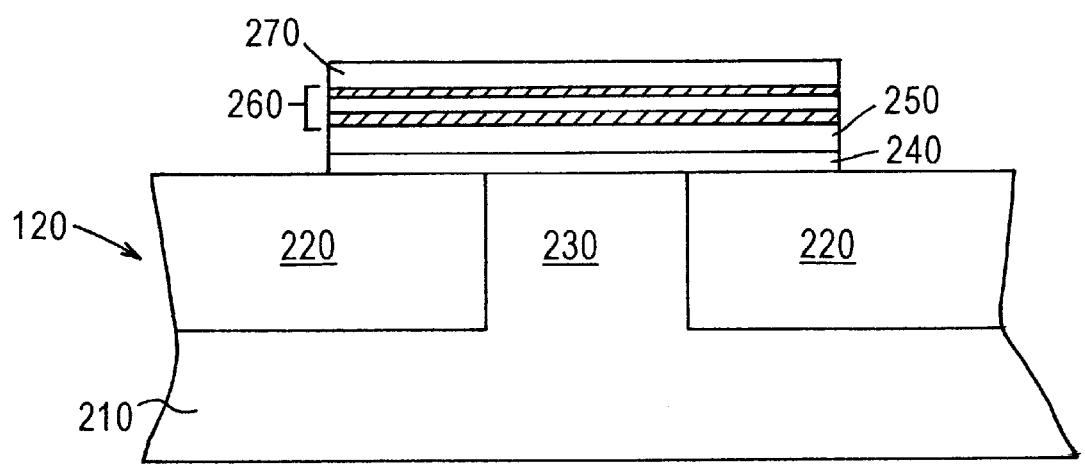
FIG. 1 is a cross-sectional view of a floating gate memory cell.
Figure 2:
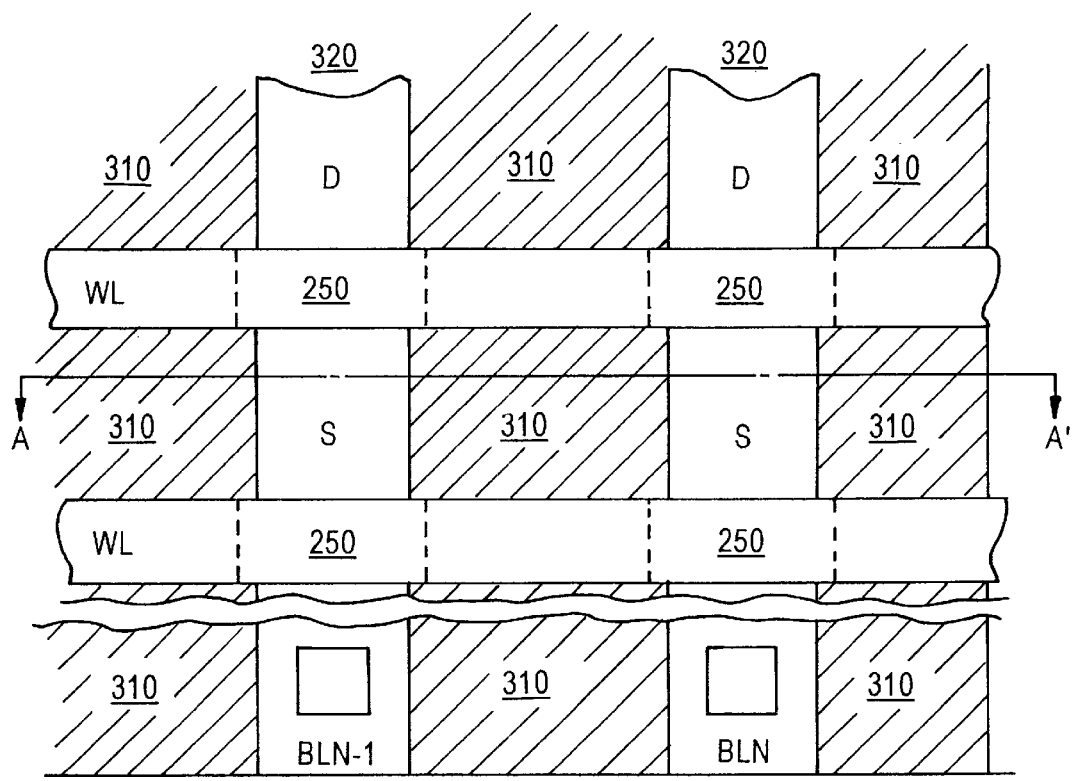
FIG. 2 is a plan view of the core area of a flash memory system.
Figure 4A:
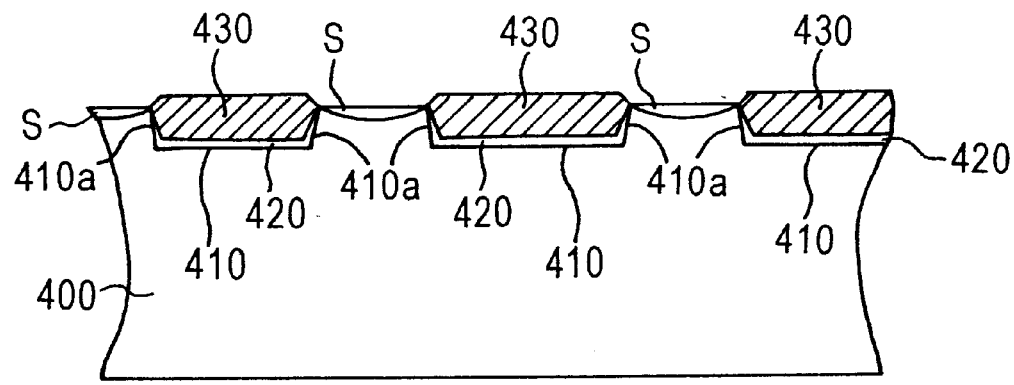
FIGS. 4A and 4B illustrate sequential phases in the formation of a conventional flash memory system.
Figure 4B:
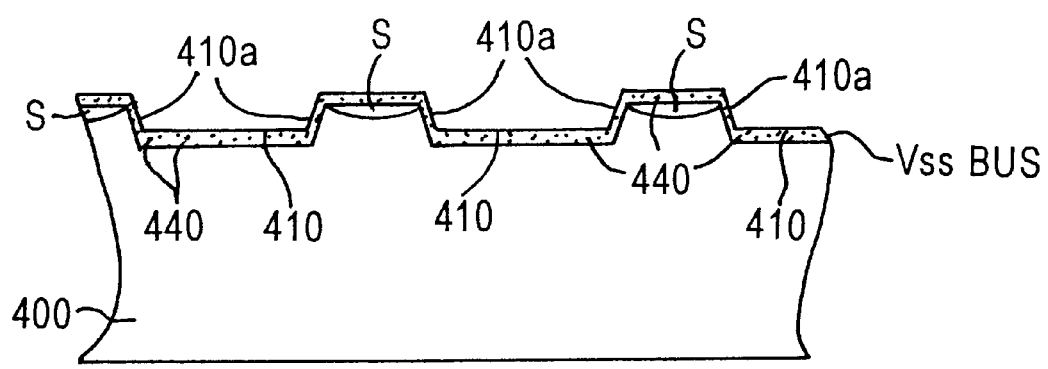
Figure 5A:
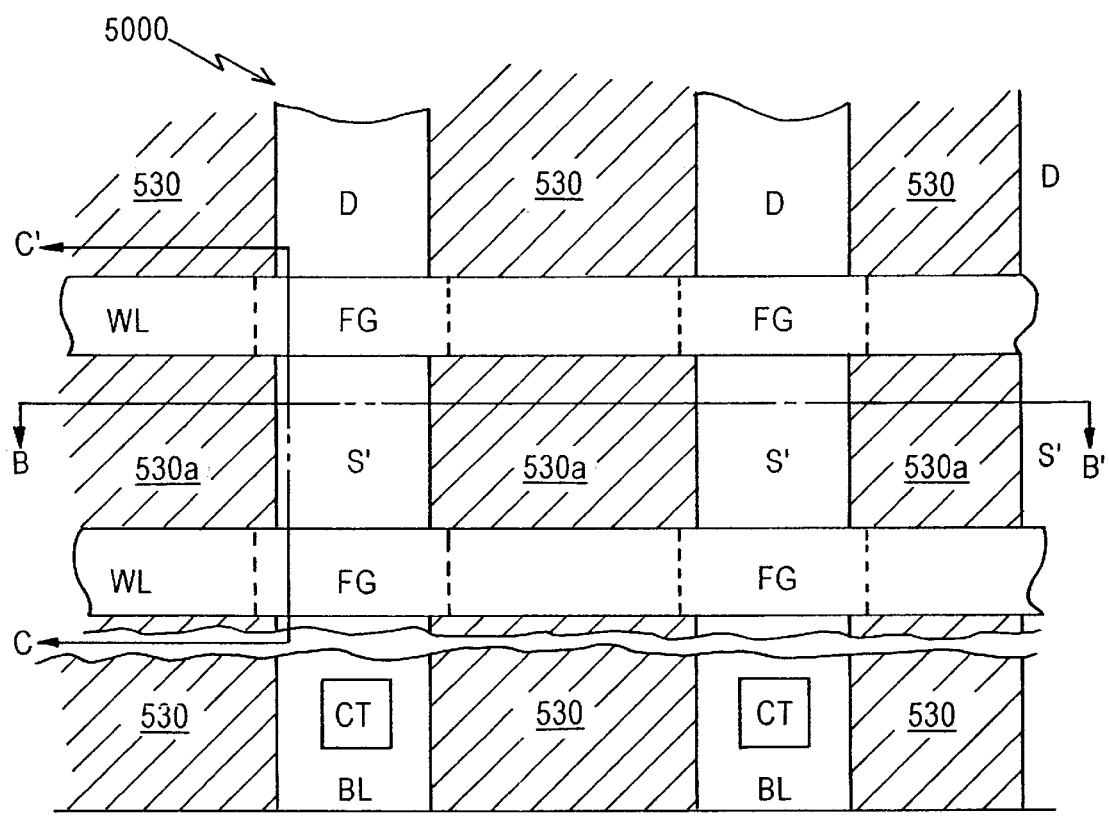
FIGS. 5A–5L schematically illustrate sequential phases of a method in accordance with an embodiment of the present invention.
Figure 5B:
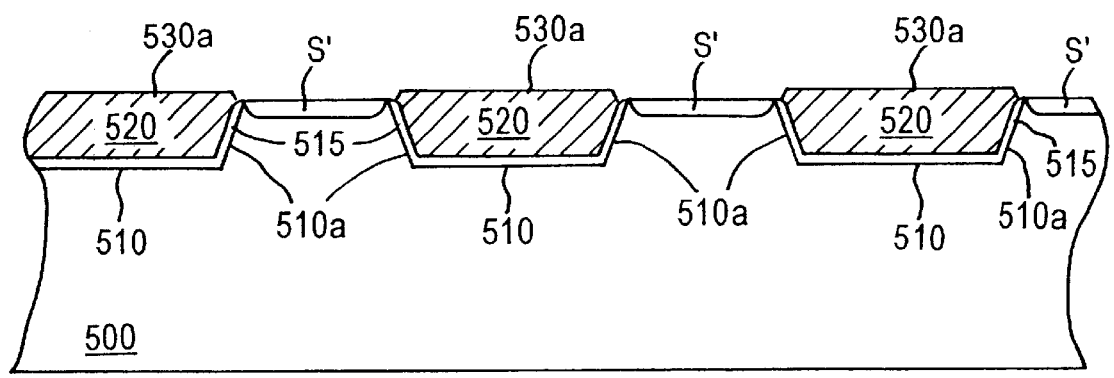

FIGS. 5A–5K schematically illustrate sequential phases of a method in accordance with an embodiment of the present invention. As depicted in FIGS. 5A and 5B, which is a cross-sectional view taken through the line B–B' in FIG. 5A, field isolation regions 530, 530a are formed in substrate 500, as by a conventional STI process, for the memory core 5000 and for peripheral circuitry (not shown). Core field oxide 530, 530a is formed as a plurality of substantially parallel, substantially rectangular rows by etching trenches 510, typically to a depth of about 2000 Å to about 3000 Å, thermally growing a liner 515 on the walls 510a of trench 510, and refilling trench 510 with an insulating material 520 such as silicon dioxide by low pressure chemical vapor deposition (LPCVD). The substantially parallel rows of field oxide 530, 530a are typically spaced about 0.3μ to about 0.41μ apart.

Figure 5C:
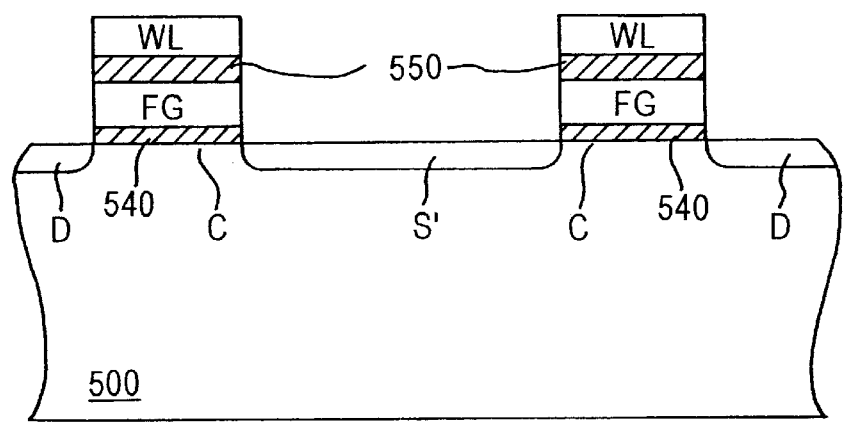

Referring now to FIG. 5A, 5B and 5C, which is a cross-sectional view taken through the line C–C' in FIG. 5A, source regions S, S' and drain regions D are formed in substrate 500 by implantation of impurities, separated by channel regions C. Tunnel oxide layer 540 is then formed, as by thermal oxidation at a temperature of about 1000° C. or higher. A first layer of polysilicon (not shown), which will form floating gates FG, is then deposited, as by low pressure chemical vapor deposition (LPCVD), masked and etched in a direction generally parallel to field oxide regions 530, 530a.

Subsequently, a dielectric layer 550 is deposited, masked and etched, followed by deposition of a second polysilicon layer (not shown), which is masked and etched to form control gates/word lines WL substantially perpendicular to the rows of field oxide 530, 530a and above floating gates FG. At the same time the second polysilicon layer is etched to form word lines WL, the first polysilicon layer is further etched to complete formation of floating gates FG above channel regions C. Source regions S, S', drain regions D, channel regions C, tunnel oxide layer 540 and floating gates FG are components of bit lines BL, and field oxide regions 530, 530a are between bit lines BL. Contact areas CT are where subsequently formed contacts will connect to bit lines BL.

Figure 5D:
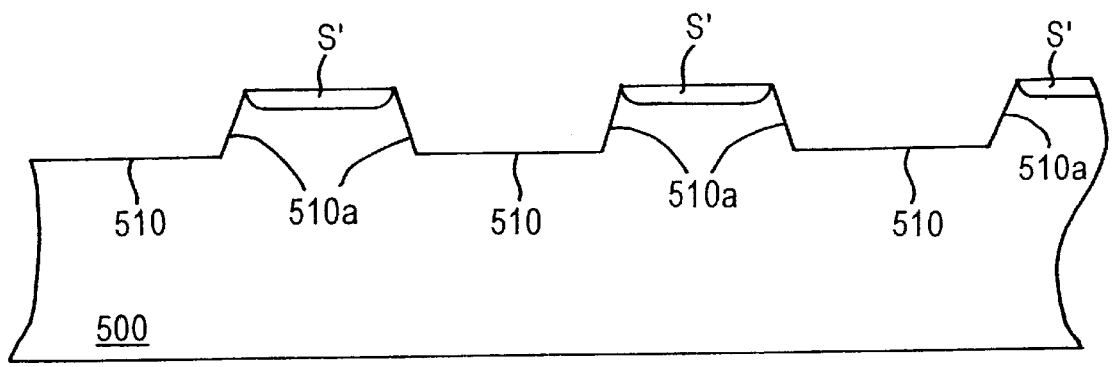
Figure 5E:
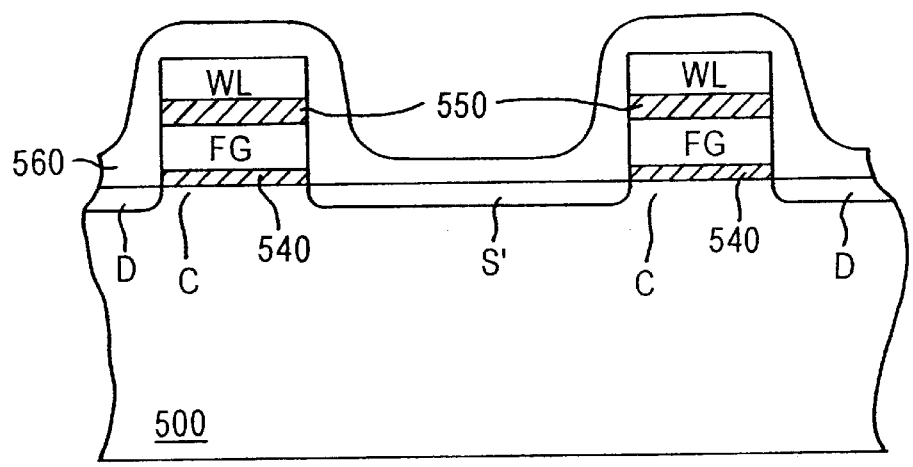
Figure 5F:
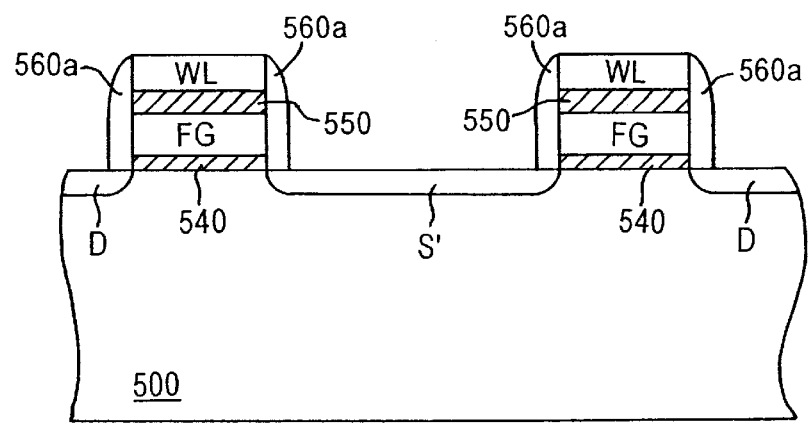

Next, referring to FIG. 5D, the same cross-sectional view taken through line B–B' as FIG. 5B, field oxide 530a between two of the word lines WL is etched away after appropriate masking of the remainder of the core region 5000. As shown in FIG. 5E, the same cross-sectional view taken through line C–C' as FIG. 5C, a dielectric layer 560, such as an oxide layer of a nitride layer, is then deposited, as by LPCVD, and anisotropically etched to form protective dielectric spacers 560a (see FIG. 5F) on the sidewalls of each floating gate FG and word line WL. Protective dielectric spacers 560a prevent the subsequently formed metal silicide layer from forming on the sidewalls and bridging word lines WL, floating gates FG and source regions S', thereby causing short circuits. In an alternative embodiment of the present invention, dictric spacers 560a are formed as described above prior to etching filed oxide 530a.

Figure 5G:
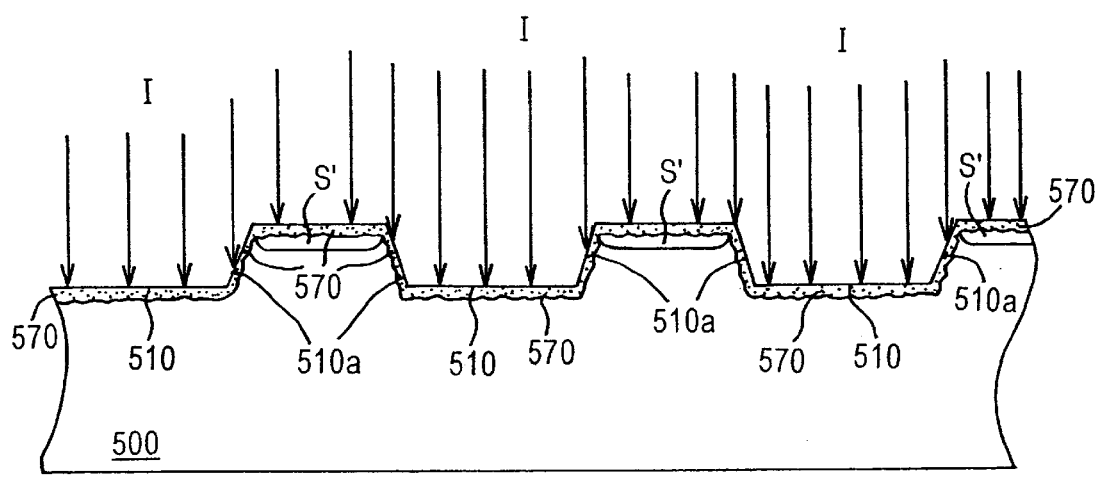

Referring now to FIG. 5G, a photoresist mask (not shown) is formed on core region 5000 having an opening to expose source regions S' and portions 510, 510a of substrate 500 between word lines WL. Impurities I are then implanted, as by ion implantation, in source regions S' and exposed portions 510, 510a of substrate 500 to form doped layer 570, such as arsenic or phosphorus at a dosage of about $5 \times 10^{13}$ atoms cm$^{-2}$ to about $1 \times 10^{15}$ atoms cm$^{-2}$ and at an energy of about 10 keV to about 60 keV; e.g., a dosage of about $3 \times 10^{14}$ atoms cm$^{-2}$ and at an energy of about 30 keV. Doped layer 570 is needed to prevent short circuits from substrate 500 to source regions S' and drain regions D through the subsequently formed metal silicide layer.

Figure 5H:
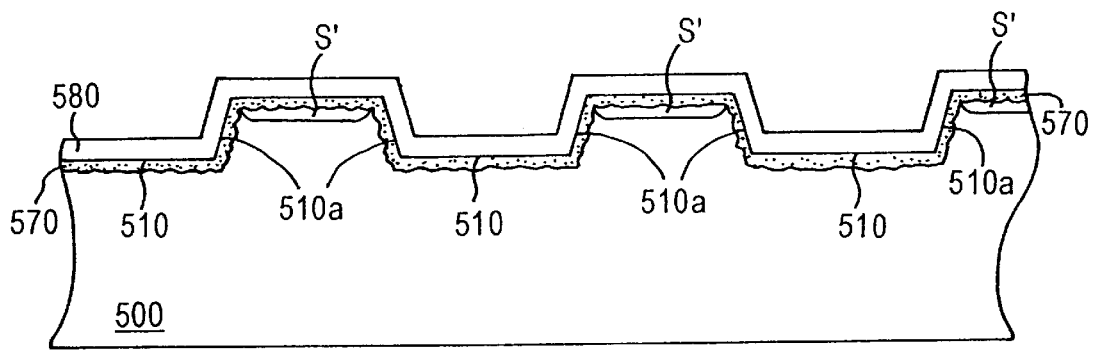
Figure 5I:
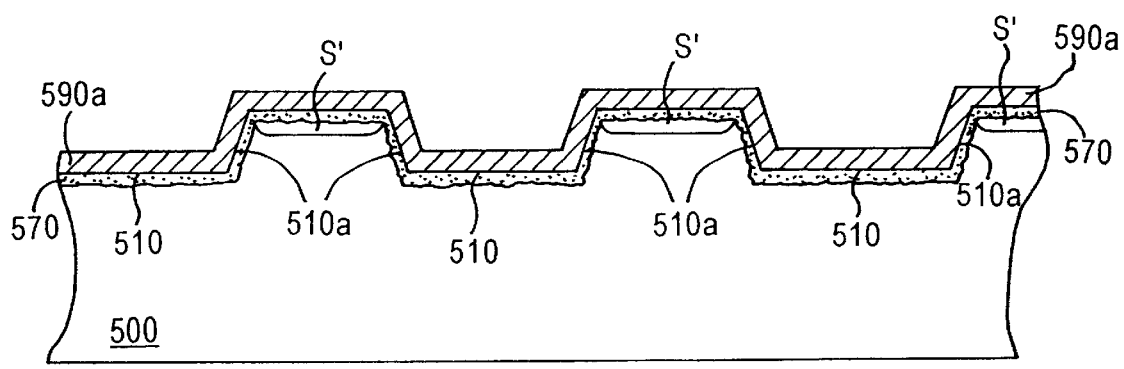

Next, a cleaning step, such as an HF dip, is performed to ensure that all native oxide is removed from portions 510, 510a of substrate 500 and source regions S'. As shown in FIG. 5H, a blanket metal layer 580 is then formed on core region 5000, including source regions S' and portions 510, 510a of substrate 500, such as titanium (Ti), cobalt (Co) or nickel (Ni), as by sputtering to a thickness of about 300 Å to about 500 Å. A low temperature rapid thermal annealing (RTA) is thereafter performed at about 400° C. to about 600° C. to cause portions of metal layer 580 to react with exposed substrate portions 510, 510a and source regions S' and form a first-phase metal silicide layer 590a, such as TiSi, CoSi or NiSi (see FIG. 5I).

Figure 5J:
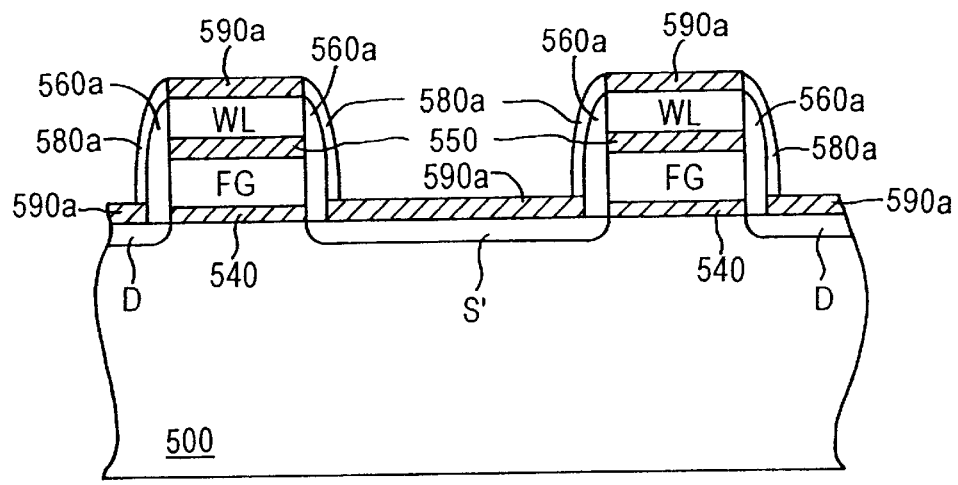

Protective dielectric spacers 560a are self-aligned by the anisotropic etch to areas where metal silicide 590a is not to be formed. In the absence of protective dielectric spacers 560a, metal silicide layer 590a would form a continuous sheet over word lines WL and bit lines BL, causing short-circuiting between word lines WL, floating gates FG, source regions S, S' and drain regions D. As shown in FIG. 5J, portions of 580a of metal layer 580 above protective dielectric spacers 560a do not react to form a silicide, and metal silicide layer 590a is self-aligned to exposed substrate portions 510, 510a and source regions S'.

Figure 5K:
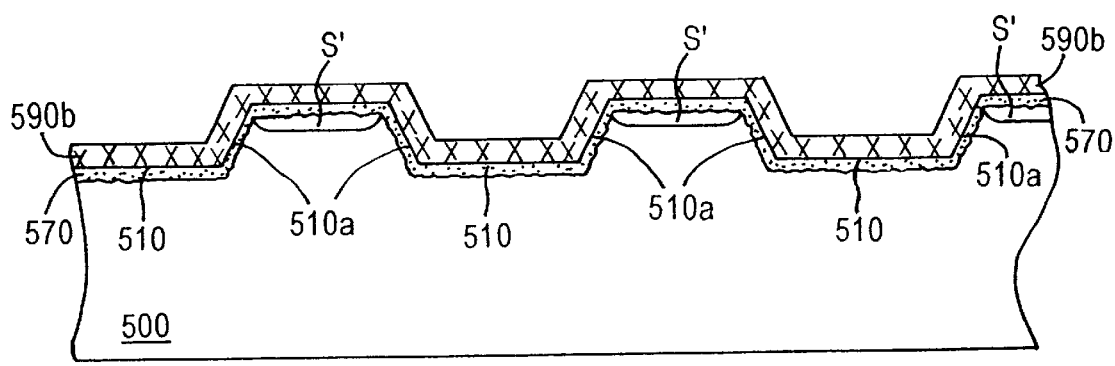

Thereafter, unreacted portions 580a of metal layer 580 are stripped away, as by wet etching with a hydrogen peroxide/ammonia hydroxide mix, and a high-temperature RTA is then performed at about 700° C. to about 900° C. to convert first-phase metal silicide layer 590a into a second-phase low-resistance metal silicide layer 590b, such as TiSi$_2$, CoSi$_2$ or NiSi$_2$, as shown in FIG. 5K.

Figure 5L:
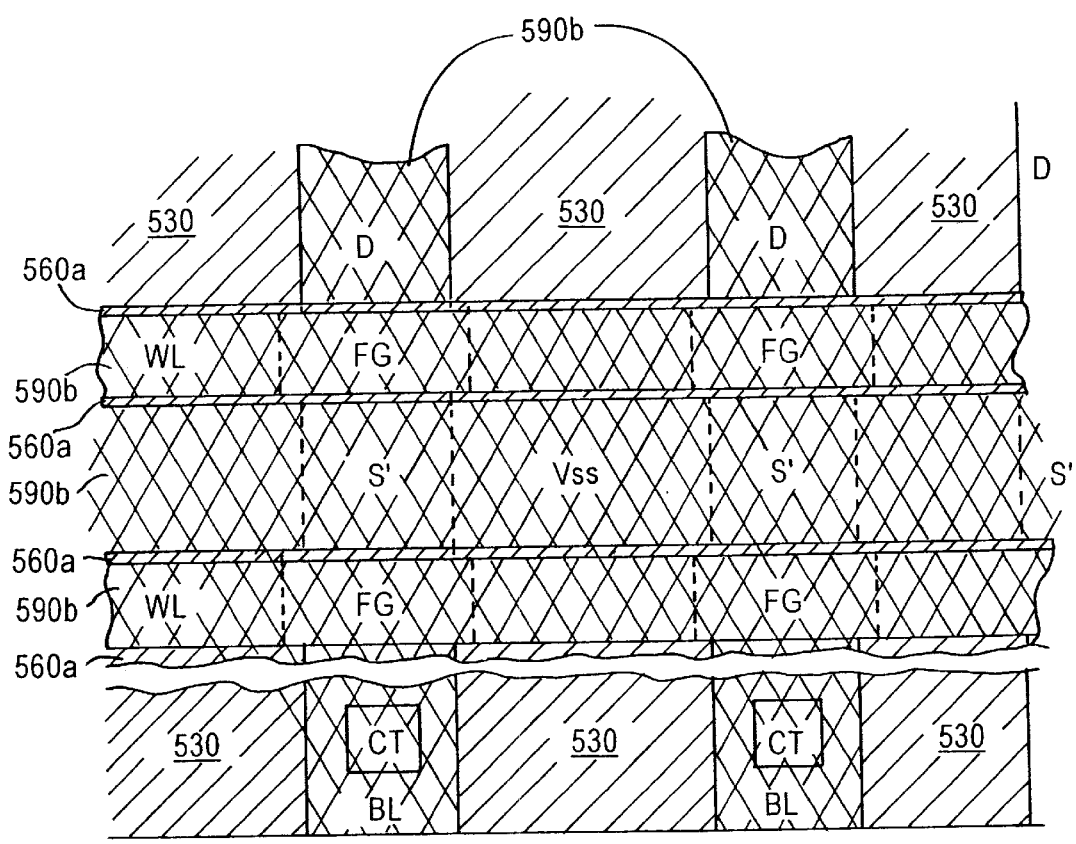

As depicted in FIG. 5L, the result of the inventive SAS process is a continuous conductor Vss formed of low-resistance metal silicide 590b. Metal silicide layer 590b is also formed on word lines WL and bit lines BL, including drain regions D. Additionally, metal silicide 590b is advantageously formed on contact areas CT, thereby reducing contact resistance, since subsequently formed contacts to bit lines BL will be formed on metal silicide, rather than on doped silicon.

In another embodiment of the present invention, rather than sputtering metal layer 580 and performing a two-step RTA process to form metal silicide 590b, a metal silicide layer, such as titanium silicide, is selectively deposited on source regions S' and exposed substrate areas 510, 510a, as by LPCVD, after the implantation of impurities shown in FIG. 5G, to thickness of about 200 Å to about 600 Å, to form continuous conductor Vss.

The present invention enables formation of a low-resistance Vss Bus in a flash memory device utilizing STI, thereby improving device performance. The low-resistance metal silicide layer 590b provides a low-resistance Vss, while the implanted impurities in doped layer 570 ensure that substrate 500 will not short circuit to source and drain regions S, S', D through metal silicide layer 590b. The present invention is applicable to the manufacture of various types of semiconductor devices, particularly high-density semiconductor devices having a design rule of about 0.25$\mu$ and under; e.g., about 0.18$\mu$ and under.

The present invention can be practiced employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiments of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, which method comprises:

forming a memory core region on a semiconductor substrate as a plurality of substantially parallel, substantially rectangular rows of field oxide separated at a first portion of each row by a source region and at a second portion of each row by a channel region adjacent to the source region;

forming the field oxide by shallow trench isolation;

forming a polysilicon floating gate above each channel region;

etching to remove the first portion of each row and expose a portion of the substrate corresponding to the first portion;

forming a protective dielectric spacer on a sidewall of each floating gate, the protective spacers extending onto each source region;

ion implanting impurities into the source regions and the exposed portions of the substrate corresponding to the first portion of each row to form a layer of the impurities; and simultaneously forming a metal silicide layer on the source regions and the exposed portions of the substrate corresponding to the first portion of each row to form a continuous conductor and on a contact area of a bit line.

2. The method according to claim 1, comprising forming the protective dielectric spacers by:

forming an oxide layer on the memory core region; and anisotropically etching to form the spacers.

3. The method according to claim 1, comprising implanting arsenic or phosphorus at a dosage of about $5 \times 10^{13}$ atoms cm$^{-2}$ to about $1 \times 10^{15}$ atoms cm$^{-2}$ and at an energy of about 10 keV to about 60 keV.

4. The method according to claim 1, comprising implanting arsenic or phosphorus at a dosage of about $3 \times 10^{14}$ atoms cm$^{-2}$ and at an energy of about 30 keV.

5. The method according to claim 1, comprising forming a photoresist mask on the memory core region having an opening to expose the source regions and the portions of the substrate corresponding to the first portion of each row prior to implanting the impurities.

6. The method according to claim 1, wherein the step of forming a metal silicide layer comprises:
   forming a metal layer on the source regions and the exposed portions of the substrate corresponding to the first portion of each row; and
   heating to form the metal silicide layer from the metal layer, the exposed portions of the substrate corresponding to the first portion of each row and the source regions.

7. The method according to claim 6, comprising sputtering the metal layer on the source regions and the exposed portions of the substrate corresponding to the first portion of each row.

8. The method according to claim 7, comprising sputtering the metal layer to a thickness of about 300 Å to about 500 Å.

9. The method according to claim 6, wherein the step of heating to form the metal silicide layer includes:
   heating at a first temperature to form a first-phase metal silicide layer from the metal layer, the source regions and the exposed portions of the substrate; and
   heating at a second temperature to form a second-phase metal silicide layer having a resistivity lower than that of the first-phase metal silicide layer.

10. The method according to claim 9, wherein the metal layer comprises titanium, the first-phase metal silicide layer comprises TiSi and the second-phase metal silicide layer comprises $TiSi_2$.

11. The method according to claim 10, wherein the step of heating at the first temperature includes rapid thermal annealing at about 400° C. to about 600° C.; and the step of heating at the second temperature includes rapid thermal annealing at about 700° C. to about 900° C.

12. The method according to claim 6, comprising:
   forming drain regions in the memory core region;
   forming the metal layer on the memory core drain regions; and
   heating to form the metal silicide layer on the memory core drain regions.

13. The method according to claim 9, comprising:
   forming the metal layer on the protective oxide spacers; and
   etching to remove the metal layer from the protective oxide spacers after forming the first-phase metal silicide layer.

14. The method according to claim 9, wherein the metal layer comprises cobalt, the first-phase metal silicide layer comprises CoSi and the second-phase metal silicide layer comprises $CoSi_2$.

15. The method according to claim 9, wherein the metal layer comprises nickel, the first-phase metal silicide layer comprises NiSi and the second-phase metal silicide layer comprises $NiSi_2$.

16. The method according to claim 1, wherein the step of forming a metal silicide layer comprises depositing a metal silicide layer by LPCVD.

17. The method according to claim 16, wherein the metal silicide layer comprises titanium silicide.

18. The method according to claim 17, comprising depositing the titanium silicide to a thickness of about 200 Å to about 600 Å.

19. The method according to claim 1, comprising:
   forming a dielectric layer on the floating gates;
   forming word lines on the dielectric layer substantially perpendicular to the rows of the field oxide and above the floating gates; and
   forming the protective dielectric spacers on sidewalls of the word lines.

20. The product produced by the method of claim 1.

21. The method according to claim 1, comprising forming the protective dielectric spacer to comprise silicon dioxide or nitride.

22. The method according to claim 1, comprising forming the protective dielectric spacer prior to etching.

23. The method according to claim 1, comprising forming the protective dielectric spacer after etching.

* * * * *